United States Patent
Hiranobu

(10) Patent No.: US 8,941,599 B2
(45) Date of Patent: Jan. 27, 2015

(54) TOUCH PANEL-ATTACHED DISPLAY DEVICE AND ANTISTATIC STRUCTURE

(75) Inventor: Jun Hiranobu, Tokorozawa (JP)

(73) Assignee: Casio Computer Co., Ltd., Tokyo (JP)

( * ) Notice: Subject to any disclaimer, the term of this patent is extended or adjusted under 35 U.S.C. 154(b) by 1017 days.

(21) Appl. No.: 13/028,344

(22) Filed: Feb. 16, 2011

(65) Prior Publication Data

US 2011/0210929 A1    Sep. 1, 2011

(30) Foreign Application Priority Data

Feb. 26, 2010    (JP) .................................. 2010-041550

(51) Int. Cl.
  G06F 3/041    (2006.01)
  G06F 3/044    (2006.01)
  H05K 5/00    (2006.01)
  G02F 1/1333    (2006.01)

(52) U.S. Cl.
  CPC .............. *G06F 3/044* (2013.01); *H05K 5/0086* (2013.01); *G02F 1/13338* (2013.01); *G02F 2202/22* (2013.01)
  USPC ......................................................... 345/173

(58) Field of Classification Search
  CPC .................................................. H05K 5/0086
  USPC .................... 345/173, 174; 206/775; 361/809
  See application file for complete search history.

(56) References Cited

U.S. PATENT DOCUMENTS

| 4,862,316 A * | 8/1989 | Smith et al. .................... 361/220 |
| 2007/0040816 A1* | 2/2007 | Toyomaki ..................... 345/174 |
| 2008/0194134 A1* | 8/2008 | Wu et al. ........................ 439/352 |
| 2010/0045618 A1* | 2/2010 | Huang .......................... 345/173 |

FOREIGN PATENT DOCUMENTS

| CN | 1916704 A | 2/2007 |
| JP | 6-067800 A | 3/1994 |
| JP | 7-160423 A | 6/1995 |
| JP | 2001-183633 A | 7/2001 |
| JP | 2002-323691 A | 11/2002 |
| JP | 2003-162375 A | 6/2003 |
| JP | 2003-233059 A | 8/2003 |

OTHER PUBLICATIONS

Japanese Office Action dated Dec. 6, 2011 (and English translation thereof) in counterpart Japanese Application No. 2010-041550.

(Continued)

*Primary Examiner* — Amare Mengistu
*Assistant Examiner* — Joseph G Rodriguez
(74) *Attorney, Agent, or Firm* — Holtz, Holtz, Goodman & Chick PC

(57) ABSTRACT

A touch panel-attached display device including: a display panel; a case having electric conductivity which is provided with an opening exposing a screen area of the display panel, the case which houses the display panel inside; and a touch panel fixed to the case on a front side of the case so as to face the opening of the case, wherein the case includes a projection formed in such a manner that a part of the case projects toward the front side from a front surface thereof, and the touch panel is fixed to the case in such a manner that a lateral surface of the touch panel and the projection face each other.

9 Claims, 6 Drawing Sheets

(56) References Cited

OTHER PUBLICATIONS

Japanese Office Action dated Aug. 7, 2012 (and English translation thereof) in counterpart Japanese Application No. 2010-041550.

Chinese Office Action dated Nov. 11, 2013 (and English translation thereof) in counterpart Chinese Application No. 201110046659.7.

* cited by examiner

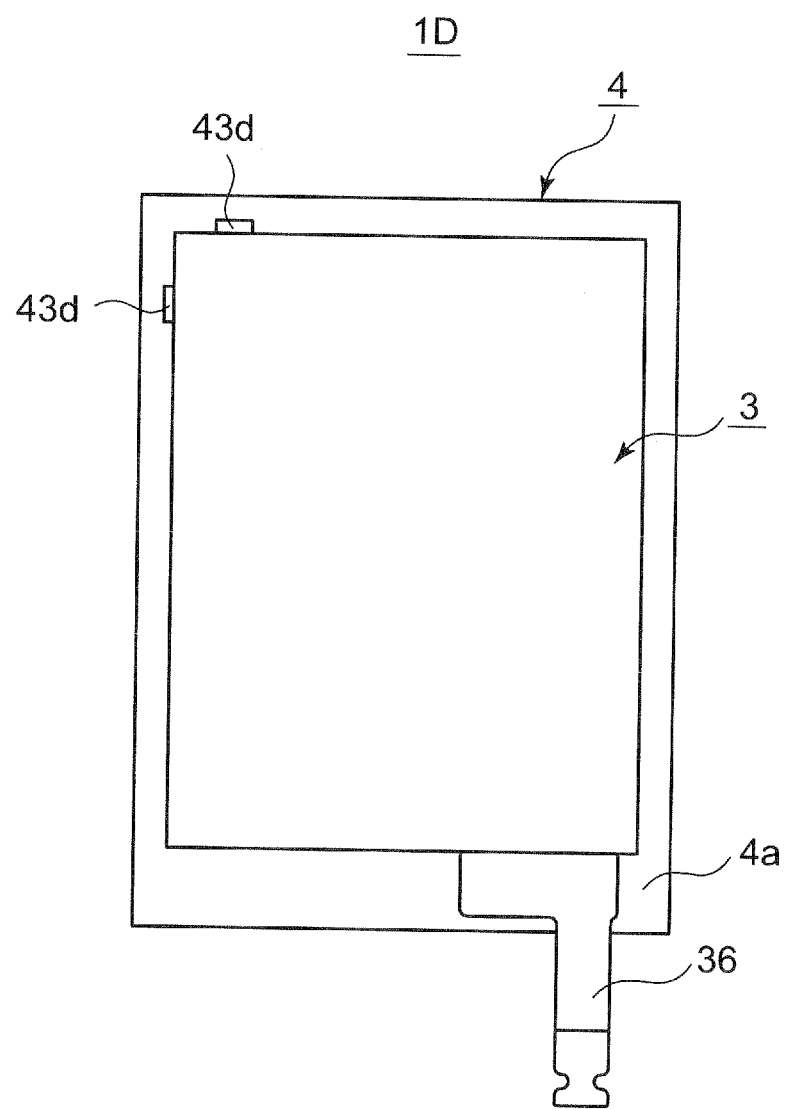

TOUCH PANEL-ATTACHED DISPLAY DEVICE AND ANTISTATIC STRUCTURE

CROSS-REFERENCE TO RELATED APPLICATIONS

This application is based upon and claims the benefit of priority under 35 USC 119 of Japanese Patent Application No. 2010-041550 filed on Feb. 26, 2010, the entire disclosure of which, including the description, claims, drawings, and abstract, is incorporated herein by reference in its entirety.

BACKGROUND OF THE INVENTION

1. Field of the Invention

The present invention relates to a touch panel-attached display device and an antistatic structure.

2. Description of the Related Art

Conventionally, there is known a touch panel-attached display device, for example, in which a touch panel is deposited on a display panel with a case having electric conductivity in between, the case which protects the display panel such as a liquid crystal display panel and protects a back light, as disclosed in Japanese Patent Application Laid-open Publication No. 2002-323691. Such a touch panel-attached display device is provided with an electric conductor, which is a separate component, in order to prevent bad influence of static electricity. The electric conductor electrically connects a part of each of transparent electrodes included in the touch panel to the case, the part which is projected from a bonding adhesive-deposited part of each of the transparent electrodes.

In such a touch panel-attached display device, it is desired to reduce the number of components as desired in other electric devices.

BRIEF SUMMARY OF THE INVENTION

A first aspect of the present invention is a touch panel-attached display device including: a display panel; a case having electric conductivity which is provided with an opening exposing a screen area of the display panel, the case which houses the display panel inside; and a touch panel fixed to the case on a front side of the case so as to face the opening of the case, wherein the case includes a projection formed in such a manner that a part of the case projects toward the front side from a front surface thereof, and the touch panel is fixed to the case in such a manner that a lateral surface of the touch panel and the projection face each other.

A second aspect of the present invention is an antistatic structure including: a case having electric conductivity which is provided with an opening exposing a screen area of a display panel, the case which houses the display panel inside; and a flat electric member fixed to the case on a front side of the case so as to face the opening of the case, wherein the case includes a projection formed in such a manner that a part of the case projects toward the front side from a front surface thereof, and the electric member is fixed to the case in such a manner that a lateral surface of the electric member and the projection face each other.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute apart of the specification, illustrate embodiments of the invention, and together with the general description given above and the detailed description of the embodiments given below, serve to explain the principles of the invention, wherein:

FIG. 6 is a front view showing a modification of the touch panel-attached display device of FIG. 1.

DETAILED DESCRIPTION OF THE INVENTION

Embodiments of the present invention will be explained with reference to the drawings.

In the following, embodiments of the present invention are described referring to the accompanying drawings. Although various limits which are preferred in order to implement the present invention are given to the embodiments described below, the scope of the present invention is not limited to the embodiments and the drawings.

Figure 1:
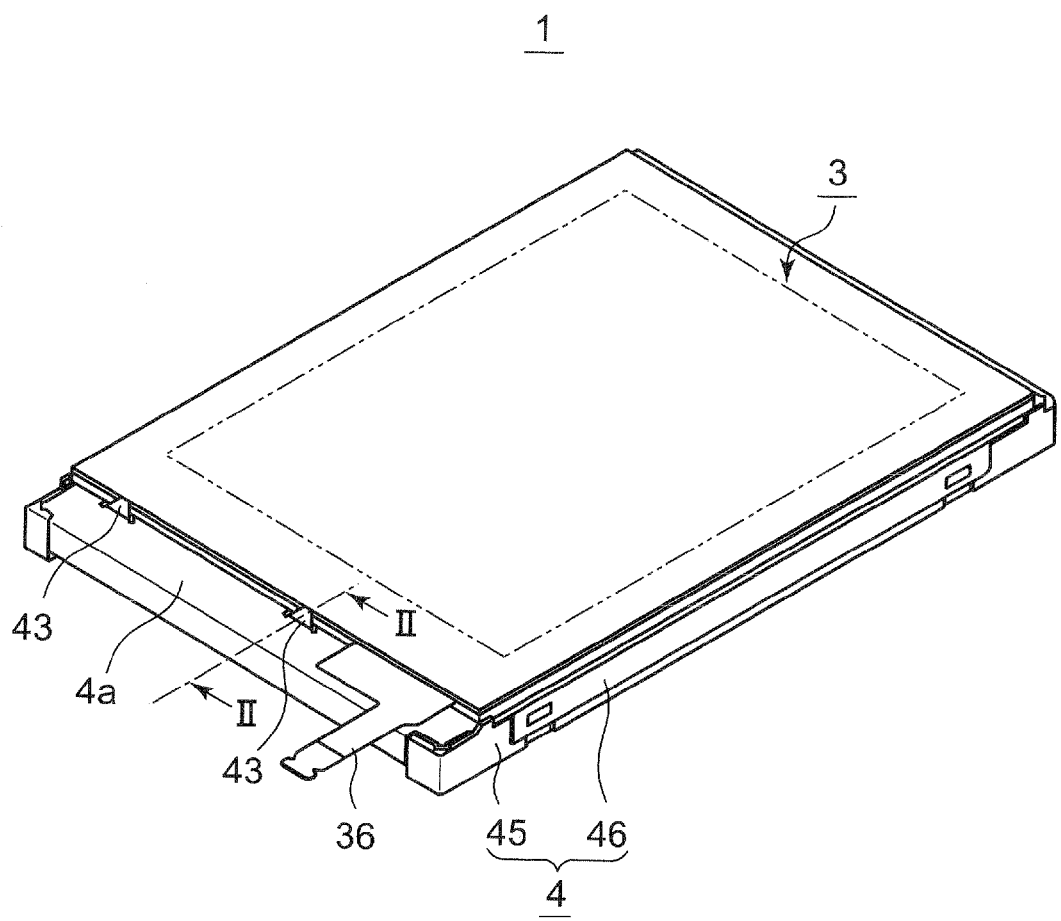
FIG. 1 is a front perspective view showing a main part of a touch panel-attached display device according to an embodiment of the present invention.
Figure 2:
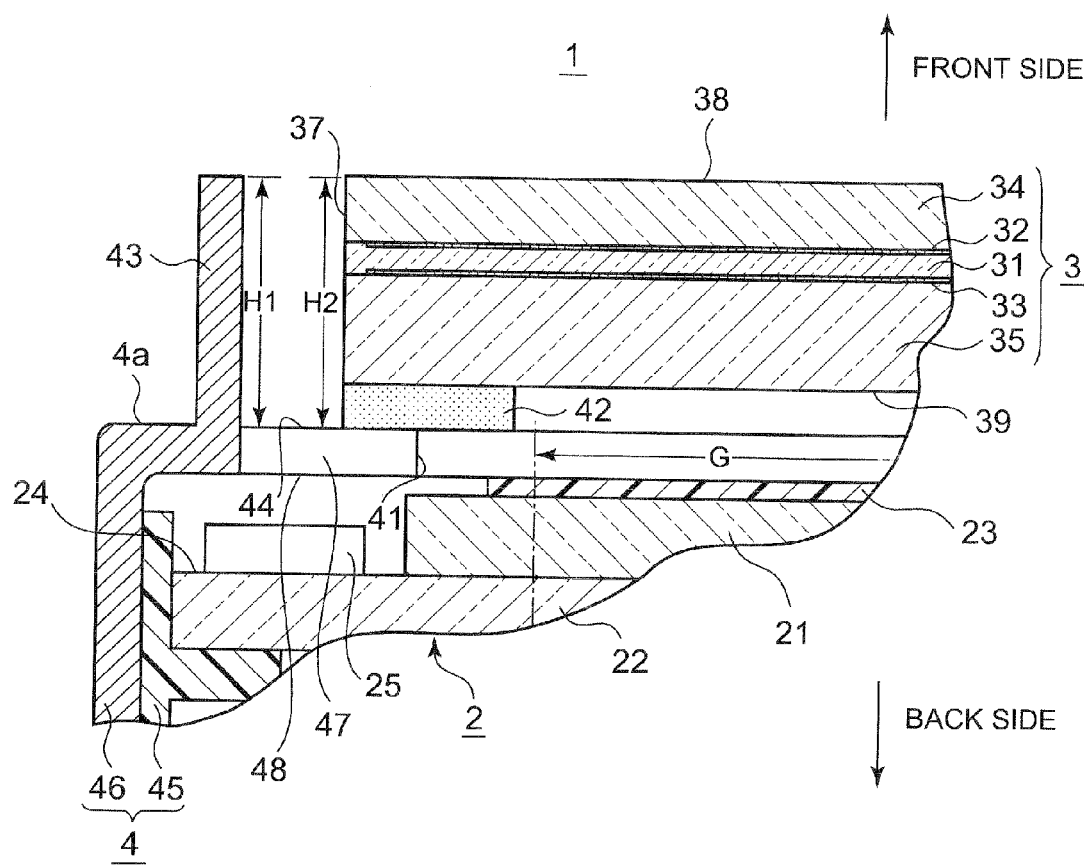
FIG. 2 is a sectional view of the touch panel-attached display device taken along the line II-II of FIG. 1.

FIG. 1 is a front perspective view showing a main part of a touch panel-attached display device according to an embodiment of the present invention. FIG. 2 is a sectional view of the touch panel-attached display device taken along the line II-II of FIG. 1. As shown in FIGS. 1 and 2, a touch panel-attached display device 1 includes a display panel 2, a touch panel (electric member) 3, and a housing 4. An antistatic structure of the present invention is applied to the touch panel-attached display device 1.

The display panel 2 is a rectangular liquid crystal display panel, for example. The display panel 2 includes a pair of transparent substrates 21 and 22. The transparent substrates 21 and 22 are deposited to face each other with a predetermined gap in between. Liquid crystal (not shown) is deposited in the gap between the transparent substrates 21 and 22 so as to be enclosed thereby. The inner surface of the transparent substrate 21 and the inner surface of the transparent substrate 22 face each other. A first transparent electrode and a second transparent electrode (both not shown) are provided on the inner surfaces of the transparent substrates 21 and 22, respectively, in such a manner that the first transparent electrode and the second transparent electrode face each other. The first and second transparent electrodes form a plurality of pixels arranged in matrix. The plurality of pixels controls transmission of light by changing the orientation of liquid crystal molecules of a liquid crystal layer by application of a voltage. To the outer surface of the transparent substrate 21, which is a substrate on the front side, a polarizing plate 23 is bonded. To the outer surface of the transparent substrate 22, which is a substrate on the back side, a polarizing plate (not shown) is bonded, too. One edge among four edges of the display panel 2 is provided with a protrusion 24 where the back-side transparent substrate 22 is protruded from the front-side transparent substrate 21. The protrusion 24 is equipped with a driving circuit 25 which drives the display panel 2 to perform displaying by applying a driving voltage between the first and second transparent electrodes described above. That is to say, the protrusion 24 is a driving circuit-equipped region. In addition, a flexible printed wiring board (not shown) which supplies control signals to the driving circuit 25 from an external circuit is connected to the protrusion 24.

The touch panel 3 is, for example, a flat rectangular capacitive touch panel, and deposited on the front side of the display panel 2. The touch panel 3 includes a transparent insulating substrate 31, a first transparent electrode 32 which is composed of an electrically conductive film formed on the front surface of the insulating substrate 31, and a second transparent electrode 33 which is composed of an electrically conductive film formed on the back surface of the insulating substrate 31. Transparent resin 34 is superposed on the front side of the insulating substrate 31 and the first transparent electrode 32 so as to cover the insulating substrate 31 and the first transparent electrode 32. Similarly, transparent resin 35 is superposed on the back side of the insulating substrate 31 and the second transparent electrode 33 so as to cover the insulating substrate 31 and the second transparent electrode 33.

In addition, a flexible printed wiring board 36 which outputs electric signals of the first transparent electrode 32 and the second transparent electrode 33 is connected to one side part of the touch panel 3.

The housing 4 includes a resin frame 45 to which the display panel 2 is fixed, and a case 46 having electric conductivity which is almost rectangular in shape, made of metal or the like, and engaged with the resin frame 45. The housing 4 houses the display panel 2 inside. A front board 47 of the case 46 of the housing 4 is provided with an opening 41 which exposes a screen area G of the display panel 2. The opening 41 of the front board 47 of the case 46 is almost rectangular in shape, and the front board 47 of the case 46 is a frame in shape. The touch panel 3 is deposited on the front side of the case 46 so as to face the opening 41 of the front board 47 of the case 46, and fixed to the front board 47 of the case 46 by a double-sided adhesive tape 42. Thus, a part of the case 46 is deposited between the display panel 2 and the touch panel 3. That is to say, the touch panel 3 is fixed to the front board 47 of the case 46 on a side of a front surface 44 of the case 46 so as to face the opening 41 of the front board 47 of the case 46, the side which is opposite to a side where the display panel 2 is deposited.

The case 46 of the housing 4 is provided with two projections 43 with a prescribed distance in between. The projections 43 are formed by making at least a part of the case 46 projected from the front surface 44 of the case 46 toward the front side. Both projections 43 are deposited on one edge among four edges of the case 46, namely, on an edge 4a which faces the protrusion 24. Thus, a surface of each of the projections 43 on a side on which the touch panel 3 is deposited faces at least a lateral surface 37 among four lateral surfaces of the touch panel 3, the lateral surface 37 which corresponds to the one edge where the protrusion 24 of the display panel 2 is formed. More specifically, each of the projections 43 is formed by bending a part of a margin of the front board 47 of the case 46 toward the front side of the case 46 so as to be perpendicular to the front surface 44 of the case 46, the margin which forms the opening 41 of the front board 47 of the case 46. Accordingly, a back surface 48 of the part of the margin of the front board 47 of the case 46 becomes a first main surface of a pair of main surfaces of the projection 43, the first main surface which is on the side where the touch panel 3 is deposited. Also, the front surface 44 of the part of the margin of the front board 47 of the case 46 becomes a second main surface of the pair of main surfaces of the projection 43, the second main surface which is on a side opposite to the side where the touch panel 3 is deposited. The projection 43 is formed to taper off to a tip, so that the projection 43 is almost triangular in shape. The tip of the projection 43 is deposited in such a manner that the height to (the level of) the tip of the projection 43 is almost the same as the height to (the level of) a front surface 38 of the touch panel 3. In the present specification, a distance from a plane including the front surface 44 of the case 46 is referred to as a height. Therefore, in this case, a height H1 which is a distance from the plane to the tip of the projection 43 is almost the same as a height H2 which is a distance from the plane to the front surface 38 of the touch panel 3.

Next, operations of the touch panel-attached display device 1 according to the embodiment of the present invention are described.

When, for example, a user of the touch panel-attached display device 1 touches the touch panel 3 with a fingertip, static electricity in the body of the user is transferred to the touch panel 3, and the static electricity built up on the touch panel 3 thereby is transferred to the projections 43 of the case 46 via the front surface 38 of the touch panel 3. Accordingly, the static electricity can be prevented from being conducted to the electric conductors (first and second transparent electrodes 32 and 33) of the touch panel 3, so that a circuit connected to the flexible printed wiring board 36 of the touch panel 3 can be prevented from being broken by bad influence of the static electricity.

As described above, in the touch panel-attached display device 1 according to the embodiment of the present invention, the touch panel 3 is fixed to the front board 47 of the case 46 in such a manner that the lateral surface 37 of the touch panel 3 and the first main surface of each of the projections 43 face each other, the first main surface which is on the side where the touch panel 3 is deposited. Consequently, the static electricity on the touch panel 3 can be transferred to the projections 43, so that the bad influence of the static electricity can be prevented. Furthermore, since the projections 43 are formed with the case 46 as a single component, the number of components of the touch panel-attached display device 1 can be less than the number of components of a conventional touch panel-attached display device which requires a separate component for preventing the bad influence of the static electricity.

The projections 43 can be easily formed since the projections 43 are formed by bending at least a part of the case 46 toward the front side of the case 46. In particular, since each of the projections 43 is formed by bending a part of the margin of the front board 47 of the case 46 toward the front side of the case 46, the margin which forms the opening 41 of the front board 47 of the case 46, each of the projections 43 can be easily formed.

The static electricity on the front surface 38 of the touch panel 3 can be efficiently transferred to the projections 43 since the height to the tip of each of the projections 43 is almost the same as the height to the front surface 38 of the touch panel 3.

In particular, since the projections 43 taper to the respective tips, the static electricity on the touch panel 3 can be transferred to the projections 43 for more certain.

The present invention is not limited to the embodiment described above, and hence can be appropriately modified. The same reference numerals are given to components described below when the components are the same as the components of the touch panel-attached display 1 according to the embodiment described above, and the explanation of the same components is omitted.

For example, in the above embodiment, a liquid crystal display panel is used as the display panel 2. However, an organic electroluminescence (EL) display panel or the like can be used as the display panel 2.

Furthermore, in the above embodiment, a capacitive touch panel is used as the touch panel 3. However, any kind of touch panel can be used as the touch panel 3 as long as an electrically conductive film is formed on at least one surface of one insulating substrate. Other than the capacitive touch panel, for example, a resistor film-type touch panel can be used as the touch panel 3.

Figure 3:
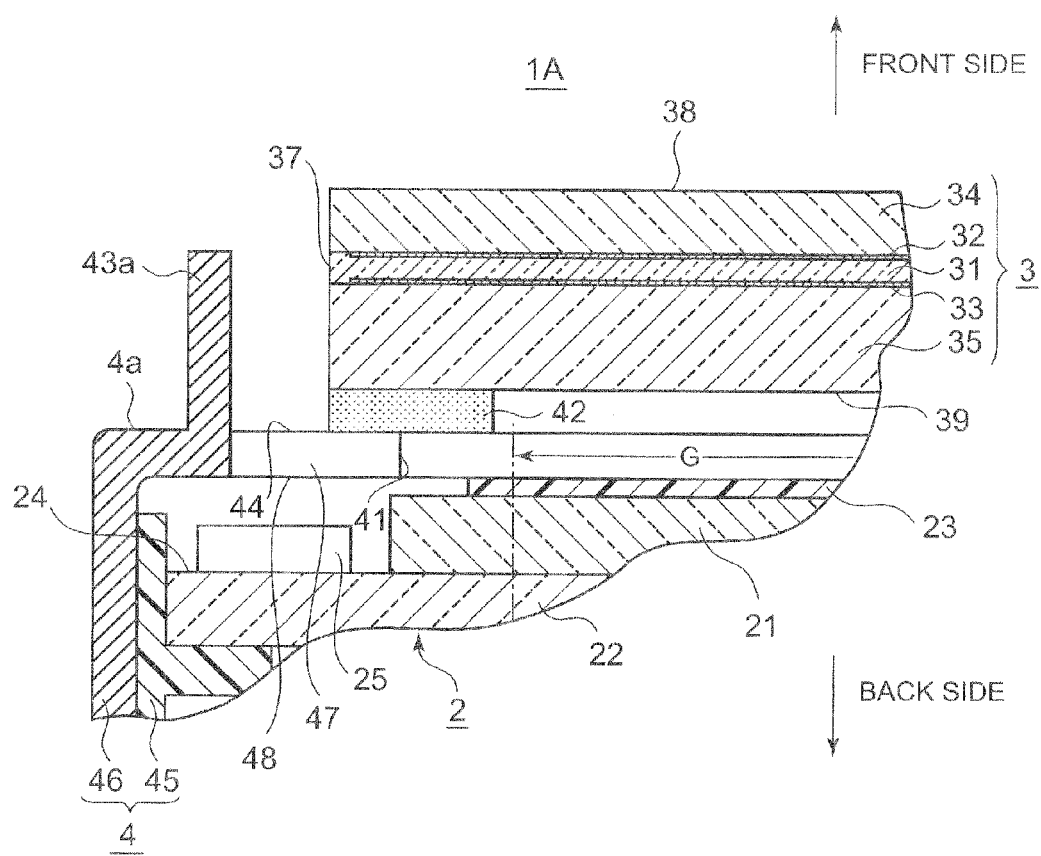
FIG. 3 is a sectional view showing a modification of the touch panel-attached display device of FIG. 2.

In the above embodiment, the case is explained, the case where the height to the tip of the projection 43 is almost the same as the height to the front surface 38 of the touch panel 3. However, for example, like a touch panel-attached display device 1A shown in FIG. 3, a projection 43a and the touch panel 3 can be deposited in such a manner that the height to (the level of) the tip of the projection 43a is almost the same as the height to (the level of) the first transparent electrode 32 of the touch panel 3. There may be a case where the static electricity on the front surface 38 of the touch panel 3 is conducted to the first transparent electrode 32. In such a case, when the tip of a projection 43a and the first transparent electrode 32 of the touch panel 3 are deposited in such a manner that the height to the tip of the projection 43a is almost the same as the height to the first transparent electrode 32 of the touch panel 3, the static electricity conducted to the first transparent electrode 32 can be easily transferred to the projection 43a.

In the above, the case where the height to the tip of the projection 43 is almost the same as the height to the front surface 38 of the touch panel 3, and the case where the height to the tip of the projection 43a is almost the same as the height to the first transparent electrode 32 of the touch panel 3, are described. Thus, it is not necessary in either case that the heights are exactly the same. The tip of the projection 43 and the front surface 38 of the touch panel 3 may be slightly misaligned, and the tip of the projection 43a and the first transparent electrode 32 of the touch panel 3 may be slightly misaligned. However, in such cases, it is desired that the height to the tip of, for example, the projection 43 is between the height to the front surface 38 of the touch panel 3 and the height to a back surface 39 of the touch panel 3, and in such a manner that the misalignment occurs within a range where the static electricity on the touch panel 3 can be easily induced to the projection 43. Furthermore, it is not necessary that the heights of the two projections 43 are the same. For example, there may be a case where the height to the tip of one of the two projections 43 is almost the same as the height to the front surface 38 of the touch panel 3, and the height to the tip of the other of the two projections 43 is almost the same as the height to the first transparent electrode 32 of the touch panel 3.

In the above embodiment, the case where the lateral surface 37 of the touch panel 3 and the first main surface of the projection 43 face each other with a prescribed gap in between is described, the first main surface which is on the side where the touch panel 3 is deposited. However, the lateral surface 37 of the touch panel 3 and the first main surface of the projection may be deposited to touch each other. More specifically, in a touch panel-attached display device 113 shown in FIG. 4, a projection 43b leans to the lateral surface 37 of the touch panel 3 in such a manner that a tip end part of the projection 43b is closer to the lateral surface 37 of the touch panel 3 than a base end part of the projection 43b is, the base end part which is connected to the front surface 44 of the case 46, and in such a manner that the tip of the projection 43b touches a front-side end part of the lateral surface 37 of the touch panel 3. Furthermore, in a touch panel-attached display device 1C shown in FIG. 5, a projection 43c leans to the lateral surface 37 of the touch panel 3 in such a manner that a tip end part of the projection 43c is closer to the lateral surface 37 of the touch panel 3 than a base end part of the projection 43c is, and in such a manner that the tip of the projection 43c touches the lateral surface 37 at a position which faces the first transparent electrode 32. When the lateral surface 37 of the touch panel 3 touches the projection 43b/43c, the static electricity on the touch panel 3 is directly transferred to the projection 43b/43c. Accordingly, the bad influence of the static electricity can be prevented for more certain.

In addition, when the projection 43b/43c touches the lateral surface 37 of the touch panel 3, the projection 43b/43c can be used for positioning the touch panel 3 in assembling.

Figure 4:
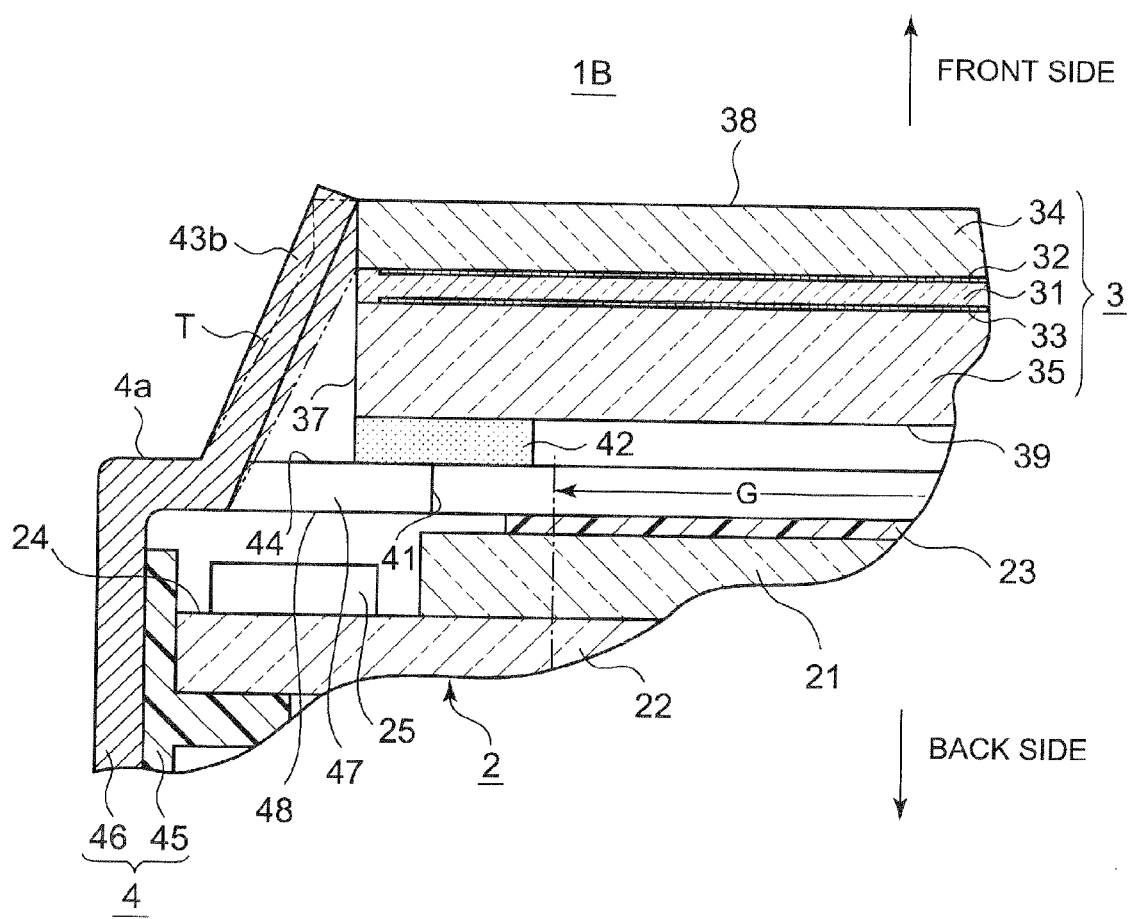
FIG. 4 is a sectional view showing a modification of the touch panel-attached display device of FIG. 2.
Figure 5:
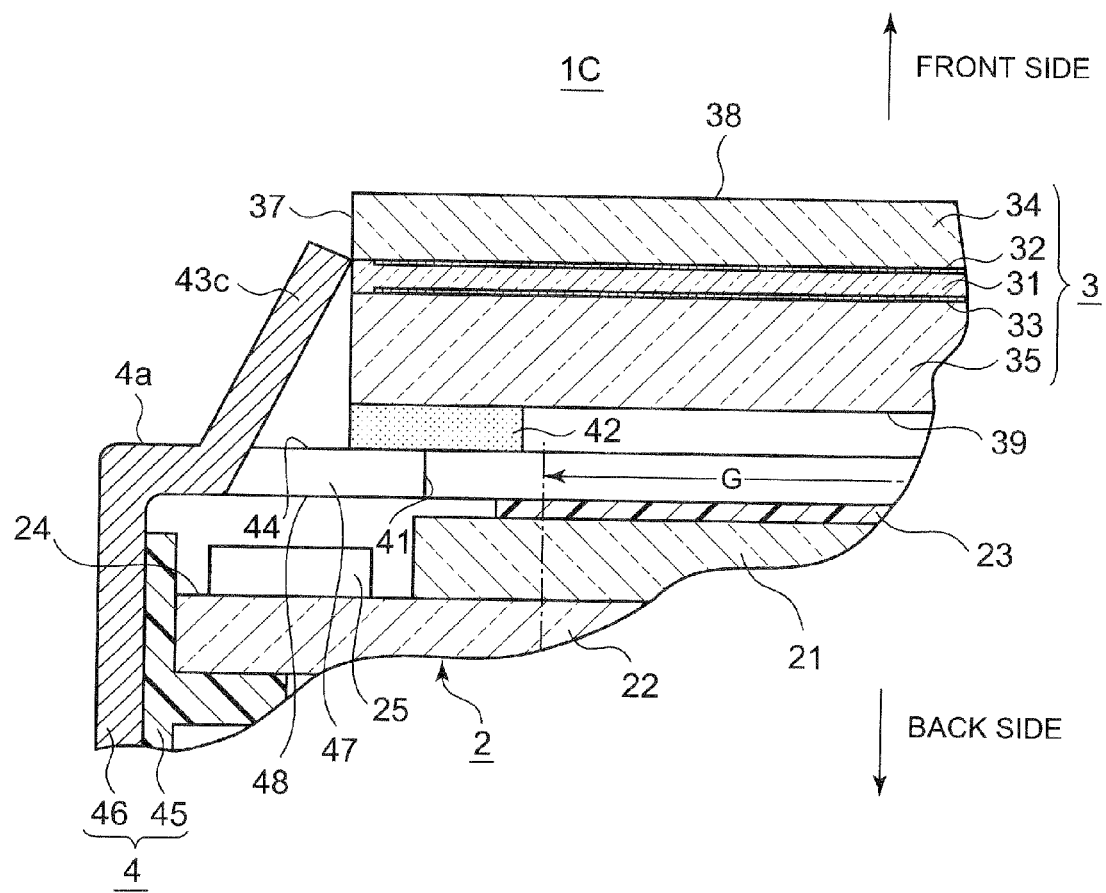
FIG. 5 is a sectional view showing a modification of the touch panel-attached display device of FIG. 2.

As a dotted-line part T shown in FIG. 4, the projection 43b may be formed to touch the lateral surface 37 of the touch panel 3 from the front-side end part of the lateral surface 37 to a position at the lateral surface 37, the position which faces the first transparent electrode 32. In this case, the static electricity on the front surface 38 of the touch panel 3 and the static electricity conducted to the first transparent electrode 32 can be directly transferred to the projection 43b.

It is possible that the projection 43/43a touches the touch panel 3 without leaning the projection 43/43a to the touch panel 3, unlike the projection 43b/43c. As a result, the whole first main surface of the projection 43/43a can touch the lateral surface 37 of the touch panel 3. When such a case is compared with the case where the projection leans to the lateral surface 37 of the touch panel 3 like the projection 43b/43c, the latter case requires a prescribed gap between the base end part of the projection 43b/43c and the lateral surface 37 of the touch panel 3. Hence, when, among four edges of the case 46, the projection 43b/43c is provided on any of three edges except for the edge 4a which faces the protrusion 24, additional space is required, the space of which the width is enough for at least the gap and the thickness of the projection 43b/43c. Thereby, such a touch panel-attached display device becomes larger in size.

As described above, among the four edges of the case 46, the projection 43b/43c is formed on the edge 4a which faces the protrusion 24. The edge 4a has more space than the other edges. Therefore, the projection 43b/43c which leans to the lateral surface 37 of the touch panel 3 can be provided thereon without making the edge 4a larger in size. Accordingly, higher degree of freedom for the shape of the projection 43b/43c can be obtained. With regard to the number of projections 43b/43c, at least one projection 43b/43c needs to be formed.

Like a touch panel-attached display device 1D shown in FIG. 6, among four edges of the housing 4, when three edges other than the edge 4a which faces the protrusion 24 also have enough space, at least two projections 43d can be formed in such a manner that, among four lateral surfaces of the touch panel 3, two lateral surfaces which are adjacent to each other face the first main surfaces of the projections 43d, respectively, the first main surfaces which are on the side where the touch panel 3 is deposited. Here, one of the projections 43d is formed in such a manner that the first main surface of the projection 43d faces one lateral surface among the four lateral surfaces of the touch panel 3, the first main surface which is on the side where the touch panel 3 is deposited. The one lateral surface is neither one of the lateral surfaces adjacent to a lateral surface including a side to which the flexible printed wiring board 36 is connected, but is a lateral surface which faces the lateral surface including the side to which the flexible printed wiring board 36 is connected. In this case, the positioning of the touch panel 3 can be performed from two directions. In addition, the static electricity on the touch panel 3 can be transferred to the projections 43*d* at positions which are away from the flexible printed wiring board 36. As a result, the bad influence of the static electricity on the flexible printed wiring board 36 can be prevented for more certain.

Two projections 43*d* may be formed on other two lateral surfaces of the touch panel 3, the two lateral surfaces which are adjacent to each other. In this case as well, the positioning of the touch panel 3 can be performed from two directions.

Furthermore, the projections described in the above embodiments may be appropriately combined. That is to say, the projections which are different from each other in height, leaning to the touch panel 3, touching state with the touch panel 3, and deposited position may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A touch panel-attached display device comprising:
a display panel;
a case having electric conductivity which houses the display panel and which is provided with an opening exposing a screen area of the display panel; and
a touch panel fixed to the case on a front side of the case so as to face the opening of the case;
wherein the case includes a projection projecting outward from a front surface of the case;
wherein the touch panel comprises an electrically conductive film disposed on a surface of an insulating substrate, and the touch panel is fixed to the case in such a manner that a lateral surface of the touch panel and the projection face each other; and
wherein the projection is substantially triangular in shape and is formed by bending a part of a front board of the case toward the front side of the case so that a back surface of the part of the front board of the case faces the lateral surface of the touch panel, and the projection leans to the touch panel in such a manner that a tip end part of the projection is closer to the lateral surface of the touch panel than a base end part of the projection, a tip of the projection touches the lateral surface of the touch panel, and a level of the tip of the projection is equal to a level of the electrically conductive film, said base end part being connected to the front surface of the case.

2. The touch panel-attached display device according to claim 1, wherein:
the display panel and the touch panel are rectangular,
the display panel includes a driving circuit-equipped region on an edge among four edges of the display panel, the driving circuit-equipped region being a region where a driving circuit allowing the display panel to perform displaying is equipped, and
the projection is disposed to face the lateral surface of the touch panel which is one lateral surface among four lateral surfaces of the touch panel corresponding to the edge among the four edges of the display panel having the driving circuit-equipped region.

3. The touch panel-attached display device according to claim 1, wherein:
the touch panel is rectangular, and the case includes a pair of said projections which are disposed to face the lateral surface of the touch panel which is one lateral surface among four lateral surfaces of the touch panel.

4. The touch panel-attached display device according to claim 1, wherein:
the touch panel is rectangular and includes a pair of said lateral surfaces which are adjacent to each other, and the case includes a pair of said projections which are disposed to face the pair of said lateral surfaces of the touch panel.

5. The touch panel-attached display device according to claim 1, wherein:
the touch panel is rectangular,
a wiring board is connected to a side of the touch panel, the wiring board outputting an electric signal of the touch panel, and
the projection is disposed to face the lateral surface of the touch panel which is one lateral surface opposing another lateral surface among four lateral surfaces of the touch panel, said another lateral surface including the side of the touch panel.

6. An antistatic structure comprising:
a case having electric conductivity which houses the display panel and which is provided with an opening exposing a screen area of the display panel; and
a flat electric member fixed to the case on a front side of the case so as to face the opening of the case;
wherein the case includes a projection projecting outward from a front surface of the case;
wherein the electric member comprises an electrically conductive film disposed on a surface of an insulating substrate, and the electric member is fixed to the case in such a manner that a lateral surface of the electric member and the projection face each other; and
wherein the projection is substantially triangular in shape and is formed by bending a part of a front board of the case toward the front side of the case so that a back surface of the part of the front board of the case faces the lateral surface of the electric member, and the projection leans to the touch panel in such a manner that a tip end part of the projection is closer to the lateral surface of the electric member than a base end part of the projection, a tip of the projection touches the lateral surface of the electric member, and a level of the tip of the projection is equal to a level of the electrically conductive film, said base end part being connected to the front surface of the case.

7. The antistatic structure according to claim 6, wherein:
the electric member is rectangular, and the case includes a pair of said projections which are disposed to face the lateral surface of the electric member which is one lateral surface among four lateral surfaces of the electric member.

8. The antistatic structure according to claim 6, wherein:
the electric member is rectangular and includes a pair of said lateral surfaces which are adjacent to each other, and the case includes a pair of said projections which are disposed to face the pair of said lateral surfaces of the electric member.

9. The antistatic structure according to claim 6, wherein:
the electric member is rectangular,
a wiring board is connected to a side of the electric member, the wiring board sending an electric signal of the electric member, and the projection is disposed to face the lateral surface of the electric member which is one lateral surface opposing another lateral surface among four lateral surfaces of the electric member, said another lateral surface including the side of the electric member.

* * * * *